United States Patent Office 3,157,505

Patented Nov. 17, 1964

3,157,505
PHOTOPOLYMERIZABLE ELEMENTS

Norman Thomas Notley, Highland Park, N.J., assignor to E. I. du Pont de Nemours and Company, Wilmington, Del., a corporation of Delaware No Drawing. Filed Jan. 23, 1959, Ser. No. 788,501
4 Claims. (Cl. 96—68)

This invention relates to photopolymerizable elements and more particularly to such elements which are suitable for the preparation of letterpress printing reliefs. Still more particularly, it relates to photopolymerizable elements having at least two layers, there being incremental increases in actinic response in descending through the layers, said elements being useful for the preparation of line and halftone printing reliefs simultaneously by a photopolymerization process.

Photopolymerizable elements, useful for preparing halftone and line printing reliefs having tapered sides, are described in Plambeck U.S. Patents 2,760,863 and 2,791,504. The degree of taper can be regulated by changing the direction of the light rays. In assignee's Plambeck U.S. application Ser. No. 640,743, filed Feb. 18, 1957, there are disclosed photopolymerizable elements having a higher concentration of initiator in lower strata of the polymerizable layer and in assignee's Crawford U.S. application Ser. No. 684,186, filed Sept. 16, 1957, there are disclosed such elements having a greater amount of thermal addition polymerization inhibitor in upper strata of the photopolymerizable layer. In using these elements with usual light sources, upon development of the reliefs the upper portions have a taper closer to the vertical axis than the lower portions. Hence, the base of the relief is broader and stronger than the surface.

While the elements of the Plambeck and Crawford applications have advantages, upon storage of the elements for a period of time there is a tendency for the photoinitiator and/or inhibitor to migrate and the concentration gradient to change so that a more uniform concentration of these ingredients eventually occurs throughout the whole layer.

An object of this invention is to provide improved photopolymerizable elements for the preparation of printing reliefs comprising two frustums, one on top of the other, the base angles of the uppermost being greater by 5° to 85° than the base angles of the lower frustum and with the major base of the lower frustum being greater than that of the upper one. Another object is to provide such elements which are stable against significant change in gradient of the ingredients upon aging. A further object is to provide such elements which can be used to make halftone and line images simultaneously. A still further object is to provide such elements in a simple and effective manner. Still further objects will be apparent from the following description of the invention.

The novel and useful photopolymerizable elements of this invention comprise a suitable support, e.g., a flexible film, foil or metal sheet, or a rigid plate, and at least two layers of photopolymerizable compositions adjacent to each other, each being from 1–100, preferably 1–20, mils in thickness and having substantial solubility in dilute aqueous basic solutions, water, water-ethanol or water-soluble or water-miscible organic solvents, e.g., alcohol, and acetone, said photopolymerizable composition containing as essential ingredients (1) at least one polymeric component, (2) an addition polymerizable compound having a normal boiling point above 100° C., a molecular weight of less than 1500 and at least two ethylenically unsaturated groups and capable of forming a high polymer by photoinitiated addition polymerization, (3) an addition polymerization initiator activatable by actinic light and preferably inactive thermanlly below 850 C. and, if desired, (4) a thermal addition polymerization inhibitor, the amount and nature of constituents (2), (3) and (4) in the layers being substantially the same but the nature of the polymeric component (1) being different and chosen so that the lower layer has an effective rate of photopolymerization at least 1.4 times greater than the upper layer. Thus, the response to unit actinic radiation in the lower layer can be 1.4 to 250 and preferably 2.5 to 10 times greater than that in the upper layer. In general, the photopolymerizable composition should be soluble in water or the developer solution in an amount from 1% to 40% by weight of said solution.

This difference in response to actinic light radiation between the two layers due to constituent (1) can be attained in various ways by providing, for example, elements with two photopolymerizable layers wherein:

(*a*) The upper layer contains at least two polymeric components and the lower layer contains at least one less polymeric component than said upper layer, (*b*) The upper and lower layers each contain two or more identical polymeric components, the relative concentrations of which differ, but the total concentration of said polymeric components in each layer is substantially the same, and (*c*) The upper and lower layers each contain one or more polymeric components, all polymeric components being different.

Photopolymerizable elements of the foregoing types can be made by preparing two different flowable coating compositions containing the three or four essential ingredients and coating them on a support in the proper relation to form the multilayer element. Alternatively, the compositions can be mixed, milled and rolled to form sheets which are applied in proper order and then pressed together with the aid of heat (e.g., at 150° C. and 200 pounds per square inch) to form a multilayer construction. These methods of forming photopolymerizable elements and suitable supports are described in the patents and applications listed above and below. If desired, an adhesive layer may be coated between the two photopolymerizable layers.

Suitable polymeric compounds or mixtures which can be used are described in the Plambeck patents cited above. Others are described in U. S. applications of assignee as follows:

(1) N-methoxymethyl polyhexamethylene adipamide mixtures as taught by the application of Saner, Ser. No. 577,829, filed April 12, 1956;

(2) Linear polyamide compositions containing extralinear N-acrylyoxymethyl groups as taught by the application of Saner et al., Ser. No. 753,344, filed August 5, 1958;

(3) Polyvinyl acetal compositions having the extralinear vinylidene groups of Martin, Ser. No. 461,291, filed October 8, 1954, U.S. Patent 2,929,710, March 22, 1960, and corresponding British Patent 786,119;

(4) Polyester polyacetal or mixed polyester acetal mixtures as in Martin Ser. No. 538,277, filed October 3, 1955, U. S. Patent 2,892,716;

(5) Blends of selected organic-soluble, base-soluble cellulose derivatives with addition-polymerizable components and photoinitiators of Martin et al., Ser. No. 596,766, filed July 9, 1956, U.S. Patent 2,927,022, Mar. 1, 1960, and corresponding Belgian Patent 559,052.

(6) Polyvinyl alcohol derivatives of Martin Ser. No 604,006, filed August 14, 1957, U.S. Patent 2,902,365, Sept. 1, 1959;

(7) Polyvinyl ether and ester compositions of Martin

Ser. No. 606,517, filed August 27, 1956, and corresponding Belgian Patent 560,154.

(8) Water-soluble cellulose ether and ester compositions of Martin Ser. No. 606,505, filed August 27, 1956, U.S. Patent 2,927,023, Mar. 1, 1960.

The foregoing polymeric compounds are preformed organic polymers of high molecular weight.

A simple test to determine whether the photopolymerizable compositions meet the criteria of responsiveness to unit actinic radiation set forth above is as follows:

Two separate photopolymerizable layers, 6 inches by 2 inches, 20 mils thick, are prepared. The photopolymerizable composition which is to be the bottom layer is exposed in six 1-inch sections to 1.75 watts of actinic radiation per square inch for 4 seconds each through a 2-mil diameter isolated dot negative, e.g., the first section is exposed for 24 seconds while the last section is exposed for only 4 seconds and intermediate sections for intermediate times. The photopolymerizable composition which is to be the upper layer is exposed in six 1-inch sections in a like manner but through a reverse image (line) negative. The time (seconds) of exposure to 1.75 watts of actinic radiation per square inch is measured for each composition, i.e., the optimum time (seconds) required to give a well-formed, raised image with slightly sloping sides with a composition considered as a candidate for the lower layer, and the optimum time (seconds) required to completely fill in a reverse image with a composition considered as a candidate for the upper layer. For an acceptable combination to be possible the ratio of the exposure requirement of the upper to the lower layer is between 1.4 and about 250, but preferably is 2.5.

In making printing reliefs by the utilization of the novel photopolymerizable elements of this invention, they are exposed through a stencil or process negative after the manner disclosed in Patent 2,760,863 and developed as described therein. A printing relief is obtained having excellent image quality with no plugging or filling within or between characters or between halftone dot reliefs.

The invention will be further illustrated by but is not to be limited to the following examples:

*Example I*

A tin plate, steel, sheet support, approximately 11 mils thick, which had been coated with a thin layer of a lacquer composed of a mixture of a vinyl acetate/vinyl chloride copolymer and a phenol formaldehyde resin, was coated with a layer of an adhesive solution prepared as described in Example 1 of assignee's Burg U.S. Ser. No. 750,868, filed July 25, 1958, to which had been added 0.16 gram of 2,2′-dihydroxy-4,4′-dimethoxybenzophenone, an antihalation agent. The adhesive layer when dried in air was 3 mils thick. The adhesive coated base support was then coated with a 20-mil layer of a photopolymerizable composition prepared from a mixture of 66.6 grams of cellulose acetate hydrogen succinate, 33.3 grams of triethylene glycol diacrylate, .03 gram of anthraquinone, as a photoinitiator, and .07 gram of p-methoxyphenol, as a polymerization inhibiter, which had been milled on a rubber mill at 150° C. for 30 minutes. A second photopolymerizable composition prepared by the same procedure but comprising 60.35 grams of cellulose acetate/hydrogen succinate and 6.25 grams of polyvinyl pryridine in addition to 33.3 grams of triethylene glycol diacrylate, .03 gram anthraquinone, and 0.7 gram p-methoxyphenol was coated, to a thickness of 20 mils, on the lower photopolymerizable layer. The resulting article was placed in a hydraulic press, the platens of which had been preheated to 150° C., and pressed for 3 minutes at 200 p.s.i. The resulting element, after storing in air for 3 days, was placed in a vacuum frame, and the photopolymerizable surface was brought into contact with a line process negative. The vacuum frame containing the element and negative was placed beneath a 1,800-watt high-pressure mercury arc and exposed to 1.75 watts of actinic radiation per sq. in. for 28.6 sec. After exposure, the negative was stripped from the plate, and the unexposed polymer was removed by spray washing with an 0.08 N solution of sodium hydroxide for 10 minutes. A sharp relief image firmly bonded to the base support and corresponding to the clear areas of the negative was obtained. The printing element thus prepared showed excellent image quality and long press life when used for printing in a flat press, the images being neither plugged nor undercut, and maintaining their original dimensions through many impressions.

*Example II*

An adhesive coated base support prepared as described in Example I was coated with a 20-mil layer of a photopolymerizable composition prepared from a mixture of 65.2 grams of cellulose acetate hydrogen succinate, 1.4 grams of polyvinyl pyridine, 33.3 grams of triethylene glycol diacrylate, 0.03 gram of anthraquinone and 0.03 gram of p-methoxyphenol milled as described in Example I. A second photopolymerizable composition prepared by the same procedure but comprising 58.6 grams of cellulose acetate hydrogen succinate and 8 grams of polyvinyl pyridine in addition to 33.3 grams of triethylene glycol diacrylate, 0.03 gram of anthraquinone, and 0.03 gram of p-methoxyphenol, was coated, to a thickness of 20 mls, on the lower photopolymerizable layer. The resulting article was placed in a hydraulic press and pressed as described in Example I. The resultant element was stored in air for 3 days and exposed to the same intensity of actinic radiation through a line process negative as described in Example I. The resultant exposed element was spray washed with an 0.08 N solution of NaOH for 10 minutes and the unpolymerized portion washed out. The printing element, of a quality equal to that of Example I, exhibited long press life when used for printing in a flat press.

*Example III*

An adhesive coated, metal base support prepared as described in Example I was coated with a 20-mil layer of a photopolymerizable composition prepared from a mixture of 44.0 g. of cellulose acetate, 6.0 g. polyvinyl pyrrolidone, 33.3 g. of triethylene glycol diacrylate, 0.03 g. anthraquinone and 0.03 g. of p-methoxyphenol. A second photopolymerizable composition prepared from a mixture of 58.6 g. of cellulose acetate hydrogen succinate, 8.0 g. polyvinyl pyridine, 33.3 g. of triethylene glycol diacrylate, 0.03 g. of anthraquinone and 0.03 g. of p-methoxyphenol as described in Example I, was coated, to a thickness of 20 mils, on the lower photopolymerizable layer. The resulting article was placed in a hydraulic press and pressed as described in Example I. The resultant element was stored in air for 2 days and exposed through a line process negative to 1.75 watts of actinic radiation per square inch for 40 seconds. The resultant exposed element was spray-washed with acetone for 20 minutes and the unpolymerized portion washed out. A printing element of a quality comparable to that of the previous examples was obtained.

*Example IV*

Example III was repeated except that the photopolymerizable element consisted of the metal base support described in Example I; a lower photopolymerizable layer, 20 mils in thickness, prepared from 53 g. of cellulose acetate hydrogen succinate, 10 g. of cellulose acetate, 37 g. of triethylene glycol diacrylate, 0.037 g. of anthraquinone and 0.037 g. of p-methoxyphenol and an upper photopolymerizable layer, 20 mils in thickness, prepared from 48 g. of cellulose acetate hydrogen succinate, 9. g. of cellulose acetate, 6 g. of polyvinyl pyridine, 37 g.

of triethylene glycol diacrylate, 0.037 g. of anthraquinone and 0.037 g. of p-methoxyphenol. The resultant element element after storing in air for 3 days was exposed through a line process negative to 1.75 watts of actinic radiation per square inch for 17 seconds. The resultant exposed element was spray-washed with an 0.08 N solution of sodium hydroxide for 10 minutes and the unpolymerized portion washed away to reveal the printing relief. A printing element of a quality comparable to that of the previous examples was obtained.

As illustrated by the examples, there are numerous variants in the photopolymerizable elements of this invention, e.g., the upper layer can comprise at least two polymeric compounds, one of which is found in the lower layer (see Example I); the upper and lower photopolymerizable layers can comprise at least two identical polymeric compounds each being present in different amounts (see Example II); and the upper layer and lower layer can each contain two different polymeric compounds, all polymeric compounds being different (see Example III). These are not the only polymeric component combinations that are possible, however, e.g., the upper and lower layers can each contain one polymeric compound and that differing between the two layers, etc. As long as the system fulfills the criteria set forth below, other polymeric component combinations may be used. The addition polymerizable ethylenically unsaturated monomeric compound, the addition polymerization photoinitiator, and the thermal polymerization inhibitor should be present, however, in each photopolymerizable layer of the system in essentially the same concentrations.

The photopolymerizable materials found in the various layers can consist of any photopolymerizable substance provided the following criteria are met: (*a*) the lower layer must be 1.4 to about 250 times as responsive to unit actinic radiation, preferably 2.5 times as responsive, and (*b*) the photopolymerizable layers must adhere to each other with or without the aid of an adhesive composition upon the application of slight heat and pressure, e.g., 150° C. and 200 p.s.i. Examples of polymeric materials which may be utilized in the present invention are disclosed in the various patents and applications identified above.

While it is preferred that the photopolymerizable elements of the present invention comprise two photopolymerizable layers, the elements can comprise more than two layers. If such is the case, the lower layers must be more responsive to unit actinic radiation than the top layer, the layer next to the base support being the most responsive. The layers should also adhere to each other upon the application of slight heat and pressure as described above. A thin layer of adhesive material may, however, be used to bind the photopolymerizable layers together, but such adhesive material must be soluble in the wash-out solution.

The supports for the photopolymerizable elements are preferably flexible and composed of metal, e.g., aluminum or steel, but they can also be rigid. In addition, they can be made of various film-forming resins or polymers. Suitable supports of these types are disclosed in Patent 2,760,863. Various anchor layers as disclosed in this patent may be used to give strong adherence between the base and the photopolymerizable layer. The adhesive compositions disclosed in assignee's U.S. application of Burg, Ser. No. 750,868, filed July 25, 1958, also are very effective.

An antihalation material can be present in the support, or in a layer or stratum on the surface of the support, or can be contained in the anchor layer. When antihalation material is used it preferably should be sufficiently absorptive of actinic light to permit reflectance from the support or combined support of no more than 35% of incident actinic light. Suitable antihalation materials are disclosed in the patents and applications referred to above.

The photopolymerizable elements may be exposed to actinic light from any source and of any type. The light may emanate from point sources or be in the form of parallel rays or divergent beams. It is preferred to use a broad light source close to the image-bearing transparency, the light rays passing through the clear areas of the transparency enter as divergent beams and thus indicate a continually diverging area in the photopolymerizable layers underneath the clear portions of the transparency. This results in a polymeric relief having its greatest width at the bottom of the photopolymerized layer, i.e., a frustum, the top surface of the relief being the dimensions of the clear area.

In most instances when thicker layers of photopolymerizable materials are utilized and the characters are smaller, even with a broad light source, the greater width at the bottom of the character has not been produced because of incomplete polymerization at the base. With the use of the polymer component differential of the present invention, however, and especially with a broad light source, reliefs are obtained which in three dimensions comprise two frustums, one on top of the other, with the base angles of the uppermost being greater than the base angles of the lower frustum and with the major base of the lower frustum being greater than that of the upper one. Similarly, the cross-section of the reliefs thus involve two trapezoids, one superposed on the other, with the same relationship between the base angles and the bases thereof. The preferred thicknesses of the photosensitive layers are approximately 3 to 20 mils.

Since free-radical-generating addition-polymerization initiators activatable by actinic light generally exhibit their maximum sensitivity in the ultraviolet range, the lght source should furnish an effective amount of this radiation. Such sources include carbon arcs, mercury-vapor arcs, fluorescent lamps with special ultraviolet-light-emitting phosphors, argon glow lamps, and photographic flood lamps. Of these, the mercury-vapor arcs, particularly the sunlamp type, and the fluorescent sunlamps, are most suitable. The sunlamp mercury-vapor arcs are customarily used at a distance of one and one-half to ten inches from the photopolymerizable layers.

The printing reliefs made in accordance with this invention can be used in all classes of printing but are most applicable to those classes of printing wherein a distinct difference of height between printing and non-printing areas is required. These classes include those wherein the ink is carried by the raised portion of the relief such as in dry-offset printing, ordinarly letterpress printing, the latter requiring greater height differences between printing and non-printing areas, and those wherein the ink is carried by the recessed portions of the relief such as in intaglio printing, e.g., line and inverted halftone. The plates are obviously useful for multicolor printing.

The present invention has advantages over the prior art because the photopolymerizable element can be exposed to the air for a long period of time and not become desensitized. In addition, due to at least two photopolymerizable layers, the lower layer of which has the greater response to unit actinic radiation, the characters formed have sides that slope in an angle of at least about 60° in the area corresponding to the upper layer of photopolymerized material, and a broader base with sloping sides (frustum) in the area corresponding to the lower layer of photopolymerized material. The broader character base enables the characters, particularly the small characters, to have better adhesion to the base support and to be less likely to break off or bend over during printing. The high angle, sloping nature of the sides of the upper portion of the printing characters enables the printing element to exhibit long press life, because, as the characters wear, there is very little image spreading and consequently no adverse effect on the quality of the print obtained. The printing characters, additionally, collect very little printing ink, paper, dust or debris between the relief image characters during printing. Still other advantages will be apparent from the above description.

What is claimed is:

1. An unexposed photopolymerizable element comprising a support and at least two adjacent solid photopolymerizable layers each being from 1 to 100 mils in thickness and containing as essential ingredients throughout its entire thickness:

(1) at least one preformed organic polymer of high molecular weight, (2) a non-gaseous, addition polymerizable ethylenically unsaturated compound having a normal boiling point above 100° C., a molecular weight less than 1500, containing at least two ethylenic groups and being capable of forming a high polymer by photoinitiated addition polymerization in the presence of an addition polymerization initiator activatable by actnic light, and (3) an addition polymerization initiator activatable by actinic light; the amount of constituents (2) and (3) being substantially the same in the adjacent photopolymerizable layers; the upper photopolymerizable layer containing at least two such preformed organic polymers and the lower layer containing at least one less of said organic polymers and the concentration of at least one of said preformed copolymers in the element is different in said adjacent layers to the extent that the lower layer has an effective rate of addition polymerization greater than that in the upper layer so that the ratio of the exposure required to completely fill in a reverse, line image in the upper layer to the exposure required to give a well-formed raised image with slightly sloping sides in the lower layer, when the two layers are exposed independently, is at least 1.4.

2. An element as defined in claim 1 wherein the upper layer contains cellulose acetate hydrogen succinate and polyvinyl pyridine and the lower layer contains cellulose acetate hydrogen succinate as the sole organic polymer having solubility in dilute aqueous sodium hydroxide.

3. An unexposed photopolymerizable element comprising a support and at least two adjacent solid photopolymerizable layers each being from 1 to 100 mils in thickness and containing as essential ingredients throughout its entire thickness:

(1) at least one preformed organic polymer of high molecular weight, (2) a non-gaseous, addition polymerizable ethylenically unsaturated compound having a normal boiling point above 100° C., a molecular weight less than 1500, containing at least two ethylenic groups and being capable of forming a high polymer by photoinitiated addition polymerization in the presence of an addition polymerization initiator activatable by actinic light, and (3) an addition polymerization initiator activatable by actinic light; the amount of constituents (2) and (3)

being substantially the same in the adjacent photopolymerizable layers; the upper and lower photopolymerizable layers each containing at least two such preformed organic polymers, the relative concentrations of which differ, but the total concentrations of said organic polymers being the same whereby the lower layer has an effective rate of addition polymerization greater than that in the upper layer so that the ratio of the exposure required to completely fill in a reverse, line image in the upper layer to the exposure requirer to give a well-formed raised image with slightly sloping sides in the lower layer, when the two layers are exposed independently, is at least 1.4.

4. An unexposed photopolymerizable element comprising a support and at least two adjacent solid photopolymerizable layers each being from 1 to 100 mils in thickness and containing as essential ingredients throughout its entire thickness:

(1) at least one preformed organic polymer of high molecular weight, (2) a non-gaseous, addition polymerizable ethylenically unsaturated compound having a normal boiling point above 100° C., a molecular weight less than 1500, containing at least two ethylenic groups and being capable of forming a high polymer by photoinitiated addition polymerization in the presence of an addition polymerization initiator activatable by actinic light, and (3) an addition polymerization initiator activatable by actinic light; the amount of constituents (2) and (3) being substantially the same in the adjacent photopolymerizable layers; and all of the organic polymers in an upper layer are different from those in a lower layer whereby the lower layer has an effective rate of addition polymerization greater than that in the upper layer so that the ratio of the exposure required to completely fill in a reverse, line image in the upper layer to the exposure required to give a well-formed raised image with slightly sloping sides in the lower layer, when the two layers are exposed independently, is at least 1.4.

References Cited in the file of this patent

UNITED STATES PATENTS

| | | |
|---|---|---|
| 2,101,061 | Gordon | Dec. 7, 1937 |
| 2,892,712 | Plambeck | June 30, 1959 |
| 2,964,401 | Plambeck | Dec. 13, 1960 |
| 2,993,789 | Crawford | July 25, 1961 |

OTHER REFERENCES

Boundy-Boyer: "Styrene," ACS Monograph, No. 115, pages 288–291 relied on, Rheinhold Publishing Co., New York, 1952.

Grant: "Hackh's Chemical Dictionary," 3rd ed., 1944, McGraw-Hill, page 4 relied on.